United States Patent
Flannery, Jr.

(10) Patent No.: US 9,588,194 B2
(45) Date of Patent: Mar. 7, 2017

(54) METHOD AND DEVICE FOR MAGNETORESISTIVE SENSOR

(71) Applicant: mCube, Incorporated, San Jose, CA (US)

(72) Inventor: Anthony F. Flannery, Jr., San Jose, CA (US)

(73) Assignee: mCube Inc., San Jose, CA (US)

(*) Notice: Subject to any disclaimer, the term of this patent is extended or adjusted under 35 U.S.C. 154(b) by 900 days.

(21) Appl. No.: 13/757,426

(22) Filed: Feb. 1, 2013

(65) Prior Publication Data
US 2013/0218510 A1    Aug. 22, 2013

Related U.S. Application Data

(60) Provisional application No. 61/593,844, filed on Feb. 1, 2012.

(51) Int. Cl.
  *G01R 33/18*    (2006.01)
  *G01R 33/09*    (2006.01)
  *G01R 35/00*    (2006.01)

(52) U.S. Cl.
  CPC .............. *G01R 33/18* (2013.01); *G01R 33/09* (2013.01); *G01R 35/005* (2013.01)

(58) Field of Classification Search
  CPC .................................................. G01R 33/18
  USPC ............................................... 702/123
  See application file for complete search history.

(56) References Cited

U.S. PATENT DOCUMENTS

| | | | |
|---|---|---|---|
| 5,632,092 A * | 5/1997 | Blank .................... | B60K 35/00 324/252 |
| 7,796,028 B1 * | 9/2010 | Kotter et al. ............ | 340/539.22 |
| 2003/0117254 A1 * | 6/2003 | Wan et al. .................. | 338/32 R |
| 2003/0132826 A1 * | 7/2003 | Wan ........................ | B82Y 25/00 338/32 R |
| 2004/0207400 A1 * | 10/2004 | Witcraft et al. ............ | 324/252 |
| 2007/0200565 A1 * | 8/2007 | Witcraft et al. ............ | 324/252 |
| 2009/0219011 A1 * | 9/2009 | James ......................... | 324/202 |
| 2012/0161756 A1 * | 6/2012 | Paci et al. .................... | 324/228 |

(Continued)

OTHER PUBLICATIONS

Honeywell, Set/Reset Function for Magnetic Sensors, AN 213, Solid State Electronics Center, www.magneticsensors.com, pp. 1-8.*

(Continued)

*Primary Examiner* — Manuel L Barbee
*Assistant Examiner* — Raymond Nimox
(74) *Attorney, Agent, or Firm* — Kilpatrick Townsend & Stockton LLP

(57) ABSTRACT

A method and structure for operating a magnetoresistive sensor system includes applying a set-reset process wherein the set-reset signal is phased through the magnetoresistive element in such a way that the set-reset field of each region is not released until the adjacent field is aligned. Starting at one end of the magnetoresistive element, the set-reset signal is activated. This aligns the domains directly underneath the first of the set-reset elements. Before this field is released, the adjacent set-reset is activated, which aligned the domains in the adjacent field. Once the adjacent field has been realigned, the set-reset field in the first region can be released, and the set-reset field in the next region can be activated. In this way, no more than two set-reset elements must be active at any one time.

20 Claims, 4 Drawing Sheets

(56) References Cited

U.S. PATENT DOCUMENTS

2012/0161759 A1* 6/2012 Pozzati et al. ............... 324/252

OTHER PUBLICATIONS

Honeywell, Set/Reset Pulse Circuits for Magnetic Sensors, AN-201, Solid State Electronics Center, www.magneticsensors.com, pp. 3-5.*

* cited by examiner

METHOD AND DEVICE FOR MAGNETORESISTIVE SENSOR

CROSS-REFERENCE TO RELATED APPLICATIONS

The present application is a non-provisional of 61/593,844 filed Feb. 1, 2012 and incorporates it by reference, for all purposes.

BACKGROUND OF THE INVENTION

The present invention relates generally to integrated circuit devices. In particular, the present invention provides a magnetoresistive sensor system and related structure and methods of operation. Additionally, the applications include at least a sensor application or magnetoresistive applications, system applications, among others. But it will be recognized that the invention has a much broader range of applicability.

Research and development in integrated microelectronics have continued to produce astounding progress in CMOS, magnetic field sensors, and MEMS (MicroElectroMechanical systems). CMOS technology has become the predominant fabrication technology for integrated circuits (IC). In layman's terms, microelectronic ICs are the "brains" of an integrated device which provides decision-making capabilities, whereas MEMS, magnetic field sensors, and others, are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC, magnetoresistive, and MEMS technology has limitless applications through modular measurement devices such as accelerometers, angular rate sensors, transducers, actuators, and other sensors and devices. In conventional vehicles, accelerometers and angular rate sensors are used to deploy airbags and trigger dynamic stability control functions, respectively. Magnetoresistive sensors are commonly used in compass systems, such as those used in aircrafts to determine heading, pitch and roll. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, health care and medical systems and the like. Magnetic sensors have also been used in applications requiring proximity switching, positioning, speed detection, current sensing and the like. As described previously, ICs, magnetic field sensors, and MEMS can be used to practically engage in various type of environmental interaction.

Although highly successful, ICs and in particular magnetoresistive sensors still have limitations. Similar to IC development, magnetoresistive sensor and MEMS development, which focuses on increasing performance, reducing size, and decreasing cost, continues to be challenging. Additionally, applications of magnetoresistive sensors and MEMS often require increasingly complex microsystems that desire greater computational power. These and other limitations of conventional magnetic sensors, MEMS, and ICs may be further described throughout the present specification and more particularly below.

From the above, it is seen that techniques for improving operation of integrated circuit devices, magnetoresistive sensors, and MEMS are highly desired.

BRIEF SUMMARY OF THE INVENTION

The present invention relates generally to integrated circuit devices. In particular, the present invention provides a magnetoresistive sensor system and related structure and methods of operation. Merely by way of example, the magnetoresistive sensor elements can include ordinary magneto-resistive (OMR) device(s), anisotropic magneto-resistive (AMR) devices, giant magneto-resistive (GMR) device(s), tunnel junction magneto-resistive (TMR), or others. Additionally, other applications include at least a sensor application or magnetoresistive applications, system applications, among others. But it will be recognized that the invention has a much broader range of applicability.

In an embodiment, the present invention provides a magnetoresistive sensor system including a magnetoresistive sensor element and a plurality of set-reset elements. In a specific embodiment, the magnetoresistive sensor element comprises a plurality of domain regions including domain regions 1 through N, and the plurality of set-reset elements includes set-reset elements 1 through N, wherein N is an integer greater than 2. Also, each of the set-reset elements 1 through N corresponds to each of the domain regions 1 through N, respectively. In a specific embodiment, each of the domain regions 1 through N are configured within a vicinity below each the set-reset elements 1 through N, respectively. The sensor element and the set-reset elements can be coupled to a processor, which is coupled to a tangible memory containing executable instructions for the method described below.

In an embodiment, the present invention provides a method of operating a magnetoresistive sensor system. The method includes applying a set-reset process wherein the set-reset signal is phased through the magnetoresistive element in such a way that the set-reset field of each region is not released until the adjacent field is aligned. Starting at one end of the magnetoresistive element, the set-reset signal is activated. This aligns the domains directly underneath the first of the set-reset elements. Before this field is released, the adjacent set-reset is activated, which aligned the domains in the adjacent field. Once the adjacent field has been realigned, the set-reset field in the first region can be released, and the set-reset field in the next region can be activated. In this way, no more than two set-reset elements must be active at any one time. The current carrying requirements for the metal routing to and from the elements can be greatly reduced.

Many benefits are achieved by way of embodiments the present invention over conventional techniques. For example, embodiments of the present technique reduce power consumption. In various specific embodiments, the current through the magnetoresistive device is reduced in a set-reset process. In some embodiments, the method provides flexibility for metal routing fabrication processes. Additionally, the method provides a process and system that are compatible with conventional semiconductor and MEMS process technologies without substantial modifications to conventional equipment and processes. Preferably, the invention provides for an improved magnetoresistive sensor system and related applications for a variety of uses. Depending upon the embodiment, one or more of these benefits may be achieved. These and other benefits will be described in more details throughout the present specification and more particularly below.

Various additional objects, features and advantages of the present invention can be more fully appreciated with reference to the detailed description and accompanying drawings that follow.

BRIEF DESCRIPTION OF THE DRAWINGS

The accompanying diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

According to embodiments of the present invention, techniques related generally to integrated devices and systems are provided. In particular, embodiments of the present invention provide methods and structures for a three-axis magnetic field sensing device. More specifically, embodiments of the present invention provide methods for forming at least one a first, second, and third magnetic field sensor element overlying a substrate member with field concentrator(s) and operably coupled to an integrated circuit (IC) layer. Merely by way of example, the magnetic field sensor elements can include ordinary magneto-resistive (OMR) device(s), anisotropic magneto-resistive (AMR) devices, giant magneto-resistive (GMR) device(s), tunnel-junction magneto-resistive (TMR), or others. Additionally, other applications include at least a sensor application or magnetic field sensing applications, system applications, among others. But it will be recognized that the invention has a much broader range of applicability.

Figure 1:
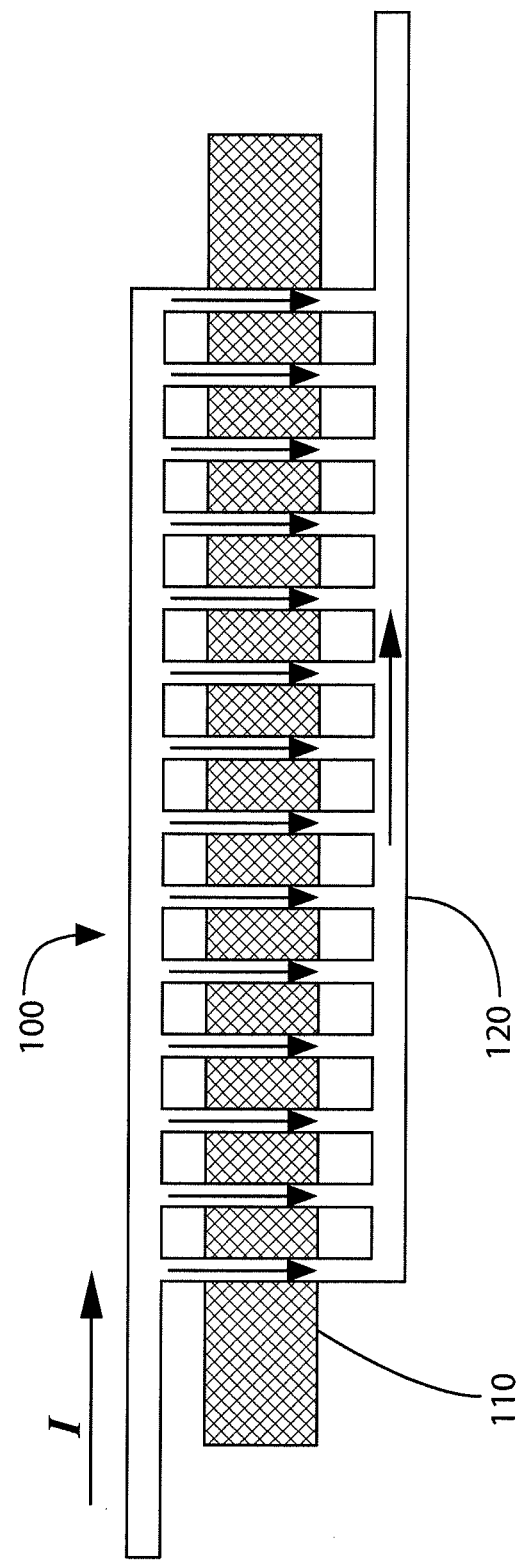
FIG. 1 is a simplified diagram of a conventional magnetoresistive sensor.

FIG. 1 is a simplified cross-sectional diagram of a magnetoresistive device according to an embodiment of the present invention. This figure shows device 100 with a magnetoresistive element 110 coupled to metal routing materials 120. Those of ordinary skill in the art will recognize other variations, modifications, and alternatives.

The magnetic domains in a typical magnetoresistive sensor element must be aligned periodically to ensure optimal operation. This is referred to as performing a "set-reset" of the element. In order for the set-reset of the element to be successful, magnetic domains must be aligned all together. If, in a localized region of the sensor, the magnetic domains are aligned by a set-reset field, but the adjacent region is not aligned, when the set-reset field is released, the misaligned region will cause the aligned region to reorient, reducing the effectiveness of the set-reset process. For this reason, in the current state of the art, the entire magnetoresistive element is aligned at once. Current is driven through all set-reset elements simultaneously, generating a field of relatively uniform direction across the entire length of the magnetoresistive element with sufficient magnitude to drive the magnetic domains of the element into alignment with each other. This process is shown in FIG. 1 with current I being driven through the entire magnetoresistive element 110.

While this has the advantage of driving all domains across all regions of the element in the same direction, it requires considerable current, since the current through each element is additive. This can place sever limitations on the metal routing required to support the level of current required for a magnetic set-reset operation.

Figure 2:
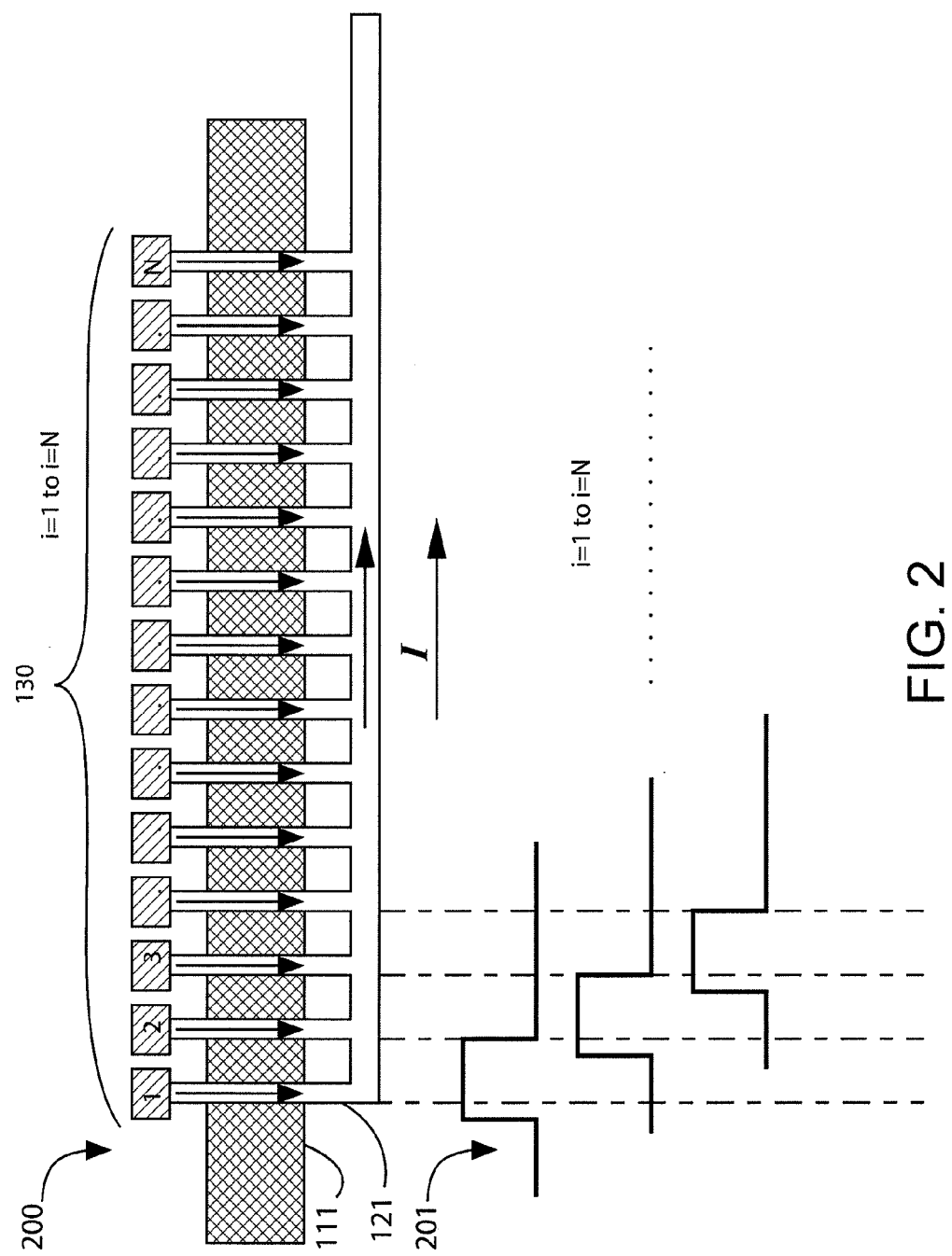
FIG. 2 is a simplified diagram of a magnetoresistive sensor according to an embodiment of the present invention.

FIG. 2 is a simplified top diagram of a device for sensing magnetic fields according to an embodiment of the present invention. This figure shows a device 200 with a magnetoresistive element 111 coupled to metal routing materials 121. The metal routing materials are connected to set-reset straps or elements 130. These set-reset straps can control the current flow through specific regions of the magnetoresistive element 111. The timing diagram 201 shows an example pattern of the set-reset straps turning on and off.

In an embodiment of the present invention, the set-reset signal is phased through the magnetoresistive element 111 in such a way that the set-reset field of each region is not released until the adjacent field is aligned. Starting at one end of the magnetoresistive element 111, the set-reset signal is activated. This aligns the domains directly underneath the first of the set-reset elements 130. Before this field is released, the adjacent set-reset is activated, which aligned the domains in the adjacent field. Once the adjacent field has been realigned, the set-reset field in the first region can be released, and the set-reset field in the next region can be activated. In this way, no more than two set-reset elements 130 must be active at any one time. The current carrying requirements for the metal routing to and from the elements can be greatly reduced.

In an embodiment, the timing of the set-reset straps can be controlled by integrated circuitry that has been built on the same substrate within a magnetoresistive sensor system. This system can include a magnetoresistive sensor including a magnetoresistive sensor element and a plurality of set-reset elements. The system can also include a tangible memory configured to store a plurality of non-transitory executable instructions and a processor coupled to the magnetoresistive sensor and the tangible memory. The processor can be programmed to perform a plurality of functions by the plurality of executable instructions. The system can also include a housing and a display. The display can be coupled to the processor and the magnetoresistive sensor system being spatially disposed within the housing. There can be other variations, modifications, and alternatives.

In a specific embodiment, the magnetoresistive sensor element comprises a plurality of domain regions including domain regions 1 through N and the plurality of set-reset elements includes set-reset elements 1 through N, wherein N is an integer greater than 2. Also, each of the set-reset elements 1 through N corresponds to each of the domain regions 1 through N, respectively. In a specific embodiment, each of the domain regions 1 through N are configured within a vicinity below each the set-reset elements 1 through N, respectively. Of course, there can be other variations, modifications, and alternatives.

In an embodiment, the plurality of executable instructions can include executable code that programs the processor to activate a set-reset signal in each of the plurality of set-reset elements in a stepwise pattern, wherein the set-reset signal is only active in a maximum of two set-reset elements at any given time. In a specific embodiment, the instructions can include:

executable code that programs the processor to activate a set-reset signal in set-reset element 1;

executable code that programs the processor to perform the following executable codes for i=2 to i=N, wherein i is an integer:

executable code that programs the processor to activate a set-reset signal in set-reset element i while the set-reset signal in set-reset element i-1 is still active;

executable code that programs the processor to deactivate the set-reset signal in set-reset element i-1 when domain region i-1 is aligned;

executable code that programs the processer to deactivate the set-reset signal in set-reset element N when domain region N is aligned.

Figure 3:
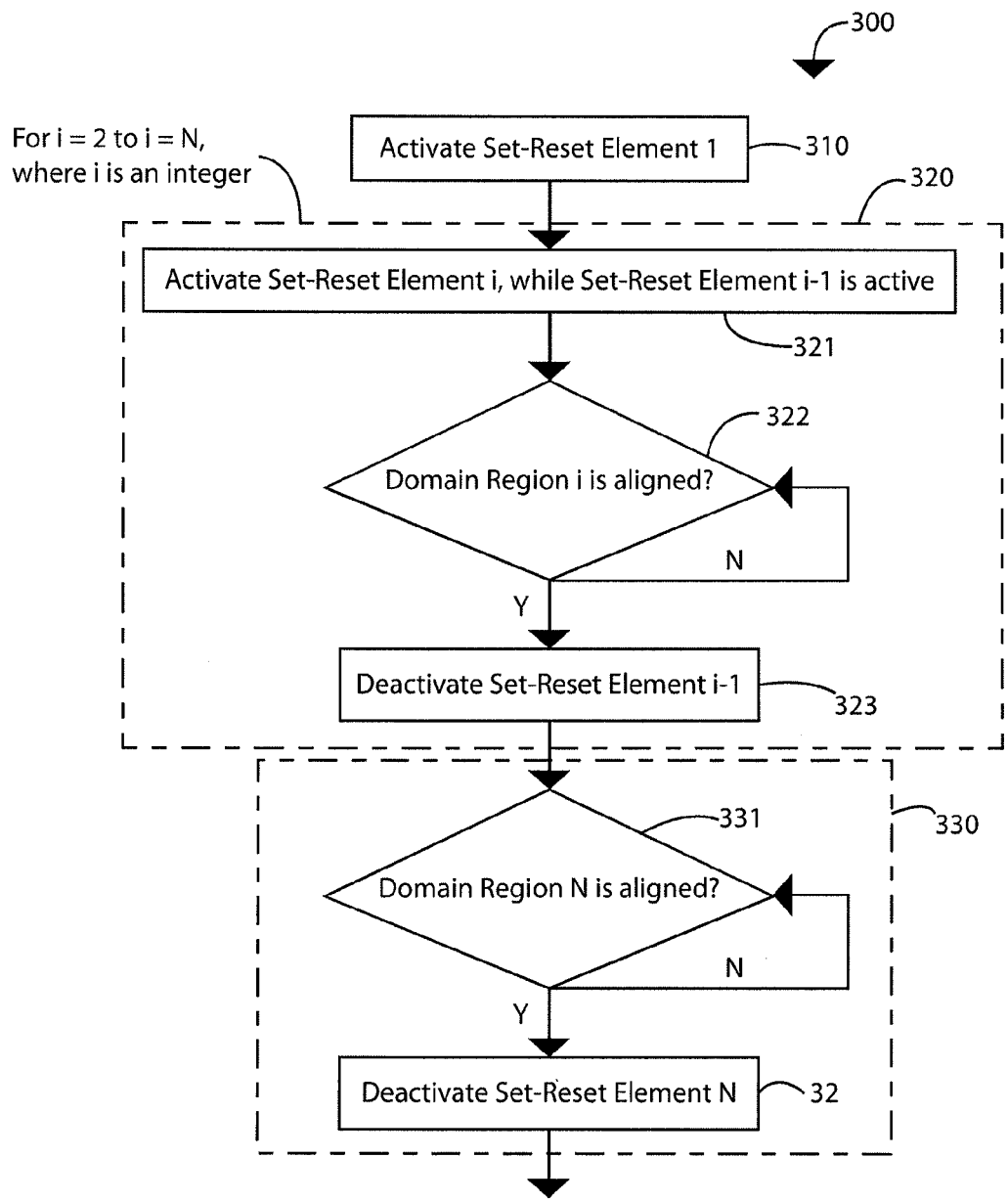
FIG. 3 is a simplified flow diagram illustrating a method of operating a magnetoresistive sensor according to an embodiment of the present invention.

FIG. 3 is a simplified flow diagram illustrating a method for operating a magnetoresistive sensor system according to an embodiment of the present invention. In an embodiment, this is a computer implemented method for operating a magnetoresistive sensor system including a magnetoresistive sensor element and a plurality of set-reset elements, implemented in the magnetoresistive sensor system programmed to perform the method. In a specific embodiment, the magnetoresistive sensor element comprises a plurality of domain regions including domain regions 1 through N and the plurality of set-reset elements includes set-reset elements 1 through N, wherein N is an integer greater than 2. Also, each of the set-reset elements 1 through N corresponds to each of the domain regions 1 through N, respectively. In a specific embodiment, each of the domain regions 1 through N are configured within a vicinity below each the set-reset elements 1 through N, respectively. Of course, there can be other variations, modifications, and alternatives.

In various embodiments, method 300 can be executed by a processor coupled to the magnetoresistive sensor, the plurality of set-reset elements, and a tangible memory including non-transitory executable instructions for performing the following steps. As shown in FIG. 3, method 300 begins at step 310, where set-reset element 1 can be activated. Then, for i=2 to i=N (where N is an integer), an instruction loop can be executed, step 320. This instruction loop can include activating set-reset element i while set-reset element i-1 is still active, step 321. Domain region i can be checked for proper aligned, step 322. If not, then the method waits until domain region is aligned, at which point set-reset element i-1 is deactivated, step 323. This method can continue until set-reset element N is activated, then step 330 can be executed. Domain region N can be checked for proper alignment, step 331, and then set-reset element N can be deactivated once that domain region is finished.

The above sequence of processes provides a method for operating a magnetoresistive sensor system according to an embodiment of the present invention. In a specific embodiment, the above sequence provides a method for aligning the magnetic domains a magnetoresistive sensor system including a magnetoresistive sensor element and a plurality of set-reset elements. As shown, embodiments of the method disclose a combination of steps including activating a set-reset signal in each of the plurality of set-reset elements in a stepwise pattern, wherein the set-reset signal is only active in a maximum of two set-reset elements at any given time. Other alternatives can also be provided where steps are added, one or more steps are removed, or one or more steps are provided in a different sequence without departing from the scope of the claims herein.

Many benefits are achieved by way of embodiments the present invention over conventional techniques. For example, embodiments of the present technique reduce power consumption. In various specific embodiments, the current through the magnetoresistive device is reduced in a set-reset process. In some embodiments, the method provides flexibility for metal routing fabrication processes. Additionally, the method provides a process and system that are compatible with conventional semiconductor and MEMS process technologies without substantial modifications to conventional equipment and processes. Preferably, the invention provides for an improved magnetoresistive sensor system and related applications for a variety of uses. Depending upon the embodiment, one or more of these benefits may be achieved. These and other benefits will be described in more throughout the present specification.

Figure 4:
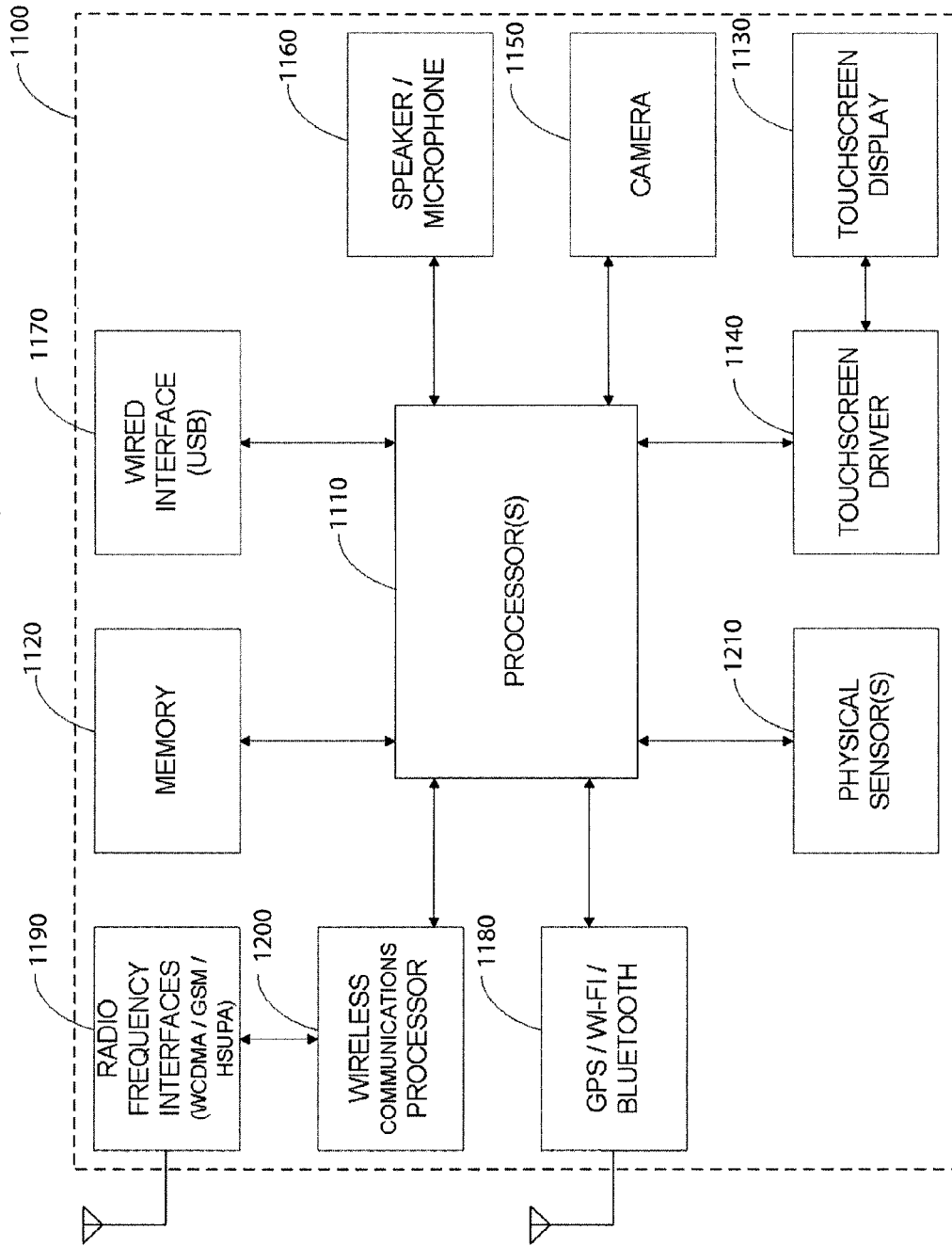
FIG. 4 is a simplified block diagram of a device incorporating various embodiments of the present invention.

FIG. 4 illustrates a functional block diagram of various embodiments of the present invention. In FIG. 4, a computing device 1100 typically includes an applications processor 1110, memory 1120, a touch screen display 1130 and driver 1140, an image acquisition device 1150, audio input/output devices 1160, and the like. Additional communications from and to computing device are typically provided by via a wired interface 1170, a GPS/Wi-Fi/Bluetooth interface 1180, RF interfaces 1190 and driver 1200, and the like. Also included in various embodiments are physical sensors 1210.

In various embodiments, computing device 1100 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 1100 may include one or more processors 1110. Such processors 1110 may also be termed application processors, and may include a processor core, a video/graphics core, and other cores. Processors 1110 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 1120 may include different types of memory (including memory controllers), such as flash memory (e.g. NOR, NAND), pseudo SRAM, DDR SDRAM, or the like. Memory 620 may be fixed within computing device 1100 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 1130 and driver 1140 may be based upon a variety of later-developed or current touch screen technology including resistive displays, capacitive displays, optical sensor displays, electromagnetic resonance, or the like. Additionally, touch screen display 1130 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 1150 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 1160 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 1110 to enable the user to operate computing device 1100 by stating voice commands. Additionally, a speech engine may be provided in various embodiments to enable computing device 1100 to provide audio status messages, audio response messages, or the like.

In various embodiments, wired interface 1170 may be used to provide data transfers between computing device 1100 and an external source, such as a computer, a remote server, a storage network, another computing device 1100, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 680 may also be provided to provide wireless data transfers between computing device 600 and external sources, such as computers, storage networks, headphones, microphones, cameras, or the like. As illustrated in FIG. 4, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 4, GPS functionality is included as part of wireless interface 1180 merely for sake of convenience, although in implementation, such functionality is currently performed by circuitry that is distinct from the Wi-Fi circuitry and distinct from the Bluetooth circuitry.

Additional wireless communications may be provided via RF interfaces 1190 and drivers 1200 in various embodiments. In various embodiments, RF interfaces 1190 may support any future-developed or conventional radio frequency communications protocol, such as CDMA-based protocols (e.g. WCDMA), GSM-based protocols, HSUPA-based protocols, or the like. In the embodiments illustrated, driver 1200 is illustrated as being distinct from applications processor 1110. However, in some embodiments, these functionalities are provided upon a single IC package, for example the Marvel PXA330 processor, and the like. It is contemplated that some embodiments of computing device 1100 need not include the RF functionality provided by RF interface 1190 and driver 1200.

FIG. 4 also illustrates computing device 1100 to include physical sensors 1210. In various embodiments of the present invention, physical sensors 1210 can be single axis or multi-axis Micro-Electro-Mechanical Systems (MEMS) based devices being developed by M-cube, the assignee of the present patent application. Physical sensors 1210 can include accelerometers, gyroscopes, pressure sensors, magnetic field sensors, magnetoresistive sensors, bio sensors, and the like. In other embodiments of the present invention, conventional physical sensors 1210 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 1130 and driver 1140 and inputs/or outputs to physical sensors 1210 may be processed in parallel processing threads. In other embodiments, such events or outputs may be processed serially, or the like. Inputs and outputs from other functional blocks may also be processed in parallel or serially, in other embodiments of the present invention, such as image acquisition device 1150 and physical sensors 1210.

FIG. 4 is representative of one computing device 1100 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 4. For example, in various embodiments, computing device 1100 may lack image acquisition unit 1150, or RF interface 1190 and/or driver 1200, or GPS capability, or the like. Additional functions may also be added to various embodiments of computing device 1100, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A computer implemented method for operating a magnetoresistive sensor system including a magnetoresistive sensor with multiple domains and a plurality of set-reset elements, implemented in the magnetoresistive sensor system programmed to perform the method comprising:
   activating, by a processor, a set-reset signal in each of the plurality of set-reset elements in a stepwise pattern, wherein the set-reset signal is only active in a maximum of two set-reset elements at any given time;
   wherein each of the plurality of set-reset elements is a current-carrying element for aligning a localized region of magnetic domains in the magnetoresistive sensor.

2. The method of claim 1 wherein the magnetoresistive sensor comprises a plurality of domain regions including domain regions 1 through N and the plurality of set-reset elements includes set-reset elements 1 through N, wherein N is an integer greater than 2.

3. The method of claim 2 wherein each of the set-reset elements 1 through N corresponds to each of the domain regions 1 through N, respectively.

4. The method of claim 2 wherein each of the domain regions 1 through N are configured within a vicinity below each the set-reset elements 1 through N, respectively.

5. The method of claim 3 further comprising
   activating, by the processor, a set-reset signal in set-reset element 1;
   performing, by the processor, the following executable codes for i=2 to i=N, wherein i is an integer:
      activating, by the processor, a set-reset signal in set-reset element i while the set-reset signal in set-reset element i-1 is still active; and
      deactivating, by the processor, the set-reset signal in set-reset element i-1 when domain region i-1 is aligned; and
   deactivating, by the processer, the set-reset signal in set-reset element N when domain region N is aligned.

6. The method of claim 1 wherein the magnetoresistive sensor comprises an ordinary magneto-resistive (OMR), an anisotropic magneto-resistive (AMR), a giant magneto-resistive (GMR), or a tunnel junction magneto-resistive (TMR) device.

7. A method for operating a magnetoresistive sensor system including a magnetoresistive sensor and a plurality of set-reset elements, the method comprising:
   activating a set-reset signal in each of the plurality of set-reset elements in a stepwise pattern, wherein the set-reset signal is only active in a maximum of two set-reset elements at any given time;
   wherein each of the plurality of set-reset elements is a current-carrying element for aligning a localized region of magnetic domains in the magnetoresistive sensor.

8. The method of claim 7 wherein the magnetoresistive sensor comprises a plurality of domain regions including domain regions 1 through N and the plurality of set-reset elements includes set-reset elements 1 through N, wherein N is an integer greater than 2.

9. The method of claim 8 wherein each of the set-reset elements 1 through N corresponds to each of the domain regions 1 through N, respectively.

10. The method of claim 8 wherein each of the domain regions 1 through N are configured within a vicinity below each the set-reset elements 1 through N, respectively.

11. The method of claim 9 further comprising
    activating, by the processor, a set-reset signal in set-reset element 1;
    performing, by the processor, the following executable codes for i=2 to i=N, wherein i is an integer:
       activating, by the processor, a set-reset signal in set-reset element i while the set-reset signal in set-reset element i-1 is still active; and
       deactivating, by the processor, the set-reset signal in set-reset element i-1 when domain region i-1 is aligned; and
    deactivating, by the processer, the set-reset signal in set-reset element N when domain region N is aligned.

12. The method of claim 1 wherein the magnetoresistive sensor comprises an ordinary magneto-resistive (OMR), an anisotropic magneto-resistive (AMR), a giant magneto-resistive (GMR), or a tunnel junction magneto-resistive (TMR) device.

13. A magnetoresistive sensor system, the system comprising:
    a magnetoresistive sensor with multiple domains and a plurality of set-reset elements;
    a tangible memory configured to store a plurality of non-transitory executable instructions; and
    a processor coupled to the magnetoresistive sensor and the tangible memory, wherein the processor is programmed to perform a plurality of functions by the plurality of executable instructions;
    wherein the plurality of executable instructions comprises:
    executable code that programs the processor to activate a set-reset signal in each of the plurality of set-reset elements in a stepwise pattern, wherein the set-reset signal is only active in a maximum of two set-reset elements at any given time;
    wherein each of the plurality of set-reset elements is a current-carrying element for aligning a localized region of magnetic domains in the magnetoresistive sensor.

14. The system of claim 13 wherein the magnetoresistive sensor comprises a plurality of domain regions including domain regions 1 through N and the plurality of set-reset elements includes set-reset elements 1 through N, wherein N is an integer greater than 2.

15. The system of claim 14 wherein each of the set-reset elements 1 through N corresponds to each of the domain regions 1 through N, respectively.

16. The system of claim 15 wherein each of the domain regions 1 through N are configured within a vicinity below each the set-reset elements 1 through N, respectively.

17. The system of claim 15 wherein the plurality of non-transitory executable instructions comprises:
    executable code that programs the processor to activate a set-reset signal in set-reset element 1;
    executable code that programs the processor to perform the following executable codes for i=2 to i=N, wherein i is an integer:
       executable code that programs the processor to activate a set-reset signal in set-reset element i while the set-reset signal in set-reset element i-1 is still active; and executable code that programs the processor to deactivate the set-reset signal in set-reset element i-1 when domain region i-1 is aligned; and executable code that programs the processer to deactivate the set-reset signal in set-reset element N when domain region N is aligned.

18. The system of claim 11 further comprising a substrate member and an IC layer disposed overlying the substrate member, wherein the IC layer is coupled to the magnetoresistive sensor, the tangible memory, and the processor.

19. The system of claim 11 wherein the magnetoresistive sensor comprises an ordinary magneto-resistive (OMR), an anisotropic magneto-resistive (AMR), a giant magneto-resistive (GMR), or a tunnel junction magneto-resistive (TMR) device.

20. The system of claim 11 further comprising a housing and a display, the display being coupled to the processor, the magnetoresistive sensor system being spatially disposed within the housing.

* * * * *